United States Patent
Liu et al.

(10) Patent No.: US 10,884,528 B2
(45) Date of Patent: Jan. 5, 2021

(54) TOUCH DISPLAY SUBSTRATE AND TOUCH DETECTION METHOD THEREOF

(71) Applicant: BOE TECHNOLOGY GROUP CO., LTD., Beijing (CN)

(72) Inventors: Yingming Liu, Beijing (CN); Xue Dong, Beijing (CN); Jing Lv, Beijing (CN); Haisheng Wang, Beijing (CN); Chunwei Wu, Beijing (CN); Xiaoliang Ding, Beijing (CN); Rui Xu, Beijing (CN); Lijun Zhao, Beijing (CN); Changfeng Li, Beijing (CN); Yanan Jia, Beijing (CN); Yuzhen Guo, Beijing (CN); Yunke Qin, Beijing (CN); Pinchao Gu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 352 days.

(21) Appl. No.: 15/776,511

(22) PCT Filed: Oct. 26, 2017

(86) PCT No.: PCT/CN2017/107750
§ 371 (c)(1),
(2) Date: May 16, 2018

(87) PCT Pub. No.: WO2018/126768
PCT Pub. Date: Jul. 12, 2018

(65) Prior Publication Data
US 2020/0272265 A1    Aug. 27, 2020

(30) Foreign Application Priority Data
Jan. 6, 2017 (CN) .......................... 2017 1 0011268

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0416* (2013.01); *G06F 3/0421* (2013.01);
(Continued)

(58) Field of Classification Search
None
See application file for complete search history.

(56) References Cited

U.S. PATENT DOCUMENTS

| 2012/0205646 A1* | 8/2012 | Cho | H01L 27/1225 257/43 |
| 2016/0170512 A1 | 6/2016 | Park | |
| 2016/0246415 A1* | 8/2016 | Bae | G06F 3/044 |

FOREIGN PATENT DOCUMENTS

| CN | 102354695 A | 2/2012 |
| CN | 105700730 A | 6/2016 |

(Continued)

OTHER PUBLICATIONS

Search Report and Written Opinion for International Application No. PCT/CN2017/107750 dated Feb. 2, 2018.
(Continued)

*Primary Examiner* — Kenneth B Lee, Jr.
(74) *Attorney, Agent, or Firm* — Calfee, Halter & Griswold LLP

(57) ABSTRACT

A touch display substrate and a touch detection method thereof. The touch display substrate includes: a base substrate, and a photo-sensitive touch element and an Organic Light-Emitting Diode ("OLED") device that are arranged on the base substrate sequentially. The photo-sensitive touch element includes a touch electrode layer, a photo-sensitive
(Continued)

material layer, an insulating layer and an ITO layer that are arranged sequentially, wherein an orthographic projection of a touch sensing area of the touch electrode layer completely covers an orthographic projection of a pattern of the photosensitive material layer, and is within an orthographic projection of the ITO layer. The arrangement of the photosensitive touch element neither changes the sequence of manufacturing the layers of the display substrate, nor affects the illumination of the touch display substrate and is suitable for manufacturing a large-size touch screen.

13 Claims, 3 Drawing Sheets

(51) Int. Cl.
*G06F 3/042* (2006.01)
*H01L 27/32* (2006.01)
*H01L 51/52* (2006.01)

(52) U.S. Cl.
CPC .......... *G06F 3/0443* (2019.05); *G06F 3/0446* (2019.05); *H01L 27/323* (2013.01); *H01L 27/3244* (2013.01); *H01L 51/5218* (2013.01); *H01L 51/5234* (2013.01); *H01L 51/5281* (2013.01); *G06F 2203/04106* (2013.01); *H01L 2251/5315* (2013.01)

(56) References Cited

FOREIGN PATENT DOCUMENTS

| CN | 106095211 A | 11/2016 |
|----|-------------|---------|
| CN | 106708323 A | 5/2017  |

OTHER PUBLICATIONS

First Office Action for Chinese Patent Application No. 201710011268.9 dated Jan. 28, 2019.

\* cited by examiner

TOUCH DISPLAY SUBSTRATE AND TOUCH DETECTION METHOD THEREOF

RELATED APPLICATIONS

The present application is the U.S. national phase entry of PCT/CN2017/107750 with an International filing date of Oct. 26, 2017, which claims the benefit of Chinese Patent Application No. 201710011268.9, filed on Jan. 6, 2017, the entire disclosure of which is incorporated herein by reference.

TECHNICAL FIELD

The present disclosure relates to the technical field of touch display substrates, and more particularly to a touch display substrate and a touch detection method thereof.

BACKGROUND ART

At present, for an OLED (Organic Light-Emitting Diode) touch screen, its touch function can be realized by either an externally-mounted means or a built-in means. For instance, a touch structure can be arranged inside a cover plate, or a cathode can serve as the pattern of the touch structure. Although the externally-mounted means can be manufactured easily, metallic wires can be obviously seen, which results in light reflection visually. However, a cathode of the built-in means needs to be divided, which may give rise to inconsistency of loading, especially for a current-driven OLED, there is a higher requirement on voltage drop across a resistance, such that the built-in means cannot be used for manufacturing a large-size touch screen (it is difficult to realize a display of more than 2 inches).

In summary, the means to realize the touch function of the existing touch screens tend to cause light reflection or are not suitable for large-size touch screens.

SUMMARY OF THE INVENTION

Some embodiments of the present disclosure provides a touch display substrate and a touch detection method thereof, so as to solve the problem with existing touch screens that cause light reflection easily or are not suitable for large-size touch displays.

An embodiment of the present disclosure provides a touch display substrate, comprising: a base substrate, and a photo-sensitive touch element and an OLED device that are arranged on the base substrate sequentially. The photo-sensitive touch element comprises a touch electrode layer, a photo-sensitive material layer, an insulating layer and an ITO layer that are arranged sequentially, wherein the touch electrode layer is closer to the base substrate than the photo-sensitive material layer. An orthographic projection of a touch sensing area of the touch electrode layer on the base substrate completely covers an orthographic projection of a pattern of the photo-sensitive material layer on the base substrate, and is within an orthographic projection of the ITO layer on the base substrate. The insulating layer is arranged in a crevice of the pattern of the touch electrode layer and in a crevice of the pattern of the photo-sensitive material layer.

In an embodiment, the ITO layer is an integral structure forming an entire layer.

In an embodiment, the touch electrode layer comprises a plurality of touch electrodes; and the touch electrodes are mutual capacitance electrodes or self-capacitance electrodes.

In an embodiment, the touch electrodes are self-capacitance electrodes; and the touch sensing area is the area where the touch electrodes are located.

In an embodiment, the pattern of the photo-sensitive material layer is a plurality of squares arranged in a matrix. In an embodiment, each square is sized to be 5 mm×5 mm.

In an embodiment, the touch electrodes are mutual capacitance electrodes, the touch electrodes comprise driving electrodes and sensing electrodes, and a touch node is formed between each driving electrode and each sensing electrode. The touch sensing area is the area where the touch nodes are located.

In an embodiment, the OLED device comprises a cathode and an anode, wherein the cathode is made of a translucent electrode material, and the anode is made of a reflective electrode material.

In an embodiment, the OLED device comprises an anti-reflection circularly polarized light layer arranged on a side of the OLED device that is remote from the base substrate.

In an embodiment, the touch display substrate further comprises a Thin-Film Transistor ("TFT") structure arranged between the photo-sensitive touch element and the OLED device, wherein the TFT structure is a top-gate structure.

In an embodiment, the OLED device comprises a plurality of sub-pixels, wherein an orthographic projection of each pattern of the photo-sensitive material layer on the base substrate covers an orthographic projection of multiple sub-pixels on the base substrate.

Some embodiments of the present disclosure provide a touch detection method for use in any one of the above touch display substrates, which comprises:

when it is determined that a finger is performing a touch operation on the touch display substrate, the photo-sensitive touch element determining a touch position by means of sensing a light reflected by the finger.

In an embodiment, it can be determined whether a finger is performing a touch operation on the touch display substrate according to the following manners:

when an OLED device of the touch display substrate displays normally, sending a square wave signal to a cathode of the OLED device and receiving a returned square wave signal; and according to the difference between the received square wave signal and the originally sent square wave signal, determining whether a finger is performing a touch operation on the touch display substrate.

In an embodiment, the photo-sensitive touch element determining a touch position by means of sensing a light reflected by the finger comprises the:

the touch display substrate providing a reference voltage that enables normal operation of the photo-sensitive material layer to an ITO layer and the touch electrode layer of the photo-sensitive touch element respectively;

the photo-sensitive material layer converting a light signal into an electric signal after sensing a light reflected by the finger, and transmitting the generated electric signal to a corresponding touch sensing area; and reading electric signals of all the touch sensing areas, and determining to the touch sensing area where a touch operation occurs according to the difference between the read electric signals and the reference voltage.

Some embodiments of the present disclosure can realize at least one of the following advantageous effects and/or other advantageous effects:

In the touch display substrate and the touch detection method thereof provided by some embodiments of the present disclosure, a photo-sensitive touch element capable of realizing the touch function is arranged between the base substrate and the OLED device. It does not change the sequence of manufacturing the layers of an existing display substrate, and since the photo-sensitive touch element is arranged below the OLED device, it will not affect the illumination of the touch display substrate and is suitable for manufacturing a large-size touch screen.

BRIEF DESCRIPTION OF DRAWINGS

To explain technical solutions of some embodiments of the present disclosure more clearly, the present disclosure provides the following drawings used for describing the embodiments. It should be realized that the following drawings are only related to some embodiments. Those ordinarily skilled in the art can obtain other drawings according to these drawings without making inventive effort, and the other drawings also fall within the scope of the present disclosure.

DETAILED DESCRIPTION

Figure 1:
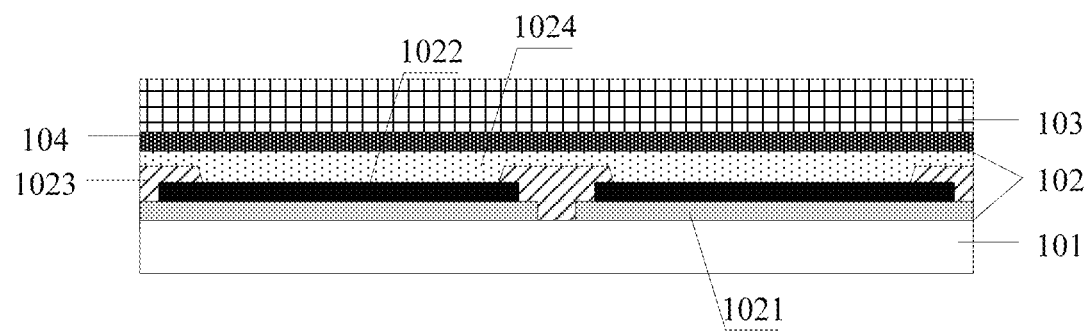
FIG. 1 is a basic structural schematic view of a touch display substrate according to an embodiment of the present disclosure.

To understand the objects, technical solutions and advantages of some embodiments more clearly, the embodiments will be described in detail with reference to the drawings and embodiments. Apparently, the embodiments described herein are only a part of, not the whole, of the embodiments of the present disclosure. All other embodiments obtained by those ordinarily skilled in the art based on the embodiments of the present disclosure without making inventive efforts fall within the protection scope of the present disclosure.

The dimensions and shapes of the structures in the drawings do not reflect the true proportions and are merely intended to schematically show the contents of the present disclosure.

The touch display substrate according to an embodiment of the present disclosure, mainly directed to a display substrate whereon touch function is needed, is provided by adding, on the basis of the existing display substrate, a photo-sensitive touch element capable of realizing a touch function arranged between a base substrate and an OLED device. The touch display substrate does not change the sequence of manufacturing the layers of an existing display substrate, and since the photo-sensitive touch element is arranged below the OLED device, it will not affect the illumination of the touch display substrate. The structure described in the present disclosure can be used as long as the display substrate can project a light reflected by a finger onto the photo-sensitive touch element, and is suitable for manufacturing a large-size touch screen. The specific structure of the touch display substrate will be explained in detail.

FIG. 1 is a basic structural schematic view of a touch display substrate according to an embodiment of the present disclosure. The touch display substrate can comprise: a base substrate 101, and a photo-sensitive touch element 102 and an OLED device 103 that are arranged on the base substrate 101 sequentially. The photo-sensitive touch element 102 can comprise a touch electrode layer 1021, a photo-sensitive material layer 1022, an insulating layer 1023 and an ITO layer 1024 that are arranged sequentially, wherein the touch electrode layer 1021 is closer to the base substrate 101 than the photo-sensitive material layer 1022. An orthographic projection of a touch sensing area of the touch electrode layer 1021 on the base substrate 101 completely covers an orthographic projection of a pattern of the photo-sensitive material layer 1022 on the base substrate 101, and is within an orthographic projection of the ITO layer on the base substrate 101. The insulating layer 1023 is arranged in a crevice of the pattern of the touch electrode layer 1021 and in a crevice of the pattern of the photo-sensitive material layer 1022.

In an embodiment, since the means to realize the touch function of the existing touch screens tend to cause light reflection or are not suitable for large-size touch screens, the touch display substrate according to some embodiments of the present disclosure is provided by adding, based on the existing display substrate, the photo-sensitive touch element 102 between the base substrate 101 and the OLED device 103 so as to realize the touch function. It does not change the sequence of manufacturing the layers of the existing display substrate, and since the photo-sensitive touch element is arranged below the OLED device, it will not affect the illumination of the touch display substrate, and is suitable for manufacturing a large-size touch screen.

To be specific, when a finger is performing a touch operation, the photo-sensitive touch element 102 can sense the light reflected by a finger onto the photo-sensitive material layer 1022, and further determine the specific position where the finger touches according to the sensed reflected light. The photo-sensitive touch element 102 can comprise a plurality of layers, which comprises, among other things, the touch electrode layer 1021, the photo-sensitive material layer 1022, the insulating layer 1023 and the ITO layer 1024 that are arranged sequentially. In addition, the photo-sensitive touch element 102 and the OLED device can be bonded by an optical adhesive 104.

The touch electrode layer 1021, the photo-sensitive material layer 1022, the insulating layer 1023 and the ITO layer 1024 are arranged sequentially, and the touch electrode layer 1021 is closest to the base substrate 101. Since the photo-sensitive material layer 1022 needs to work normally under a certain voltage, the photo-sensitive material layer 1022 can be arranged between the touch electrode layer 1021 and the ITO layer 1024. In order to insulate the electrodes of the touch electrode layer 1021 and the pattern of the photo-sensitive material layer 1022, the insulating layer 1023 is arranged in a crevice of the pattern of the touch electrode layer 1021 and in a crevice of the pattern of the photo-sensitive material layer 1022.

In addition, each layer of the photo-sensitive touch element 102 has a particular pattern, the area exerting a touch sensing function of the touch electrode layer 1021 is a touch sensing area, and the touch sensing area of the touch electrode layer 1021 is sized and positioned to completely cover the pattern of the photo-sensitive material layer 1022, in such a way to better receive an electric signal generated by the photo-sensitive material layer 1022. Namely, as shown in FIG. 1, an orthographic projection of the touch sensing area of the touch electrode layer 1021 on the base substrate 101 completely covers an orthographic projection of the pattern of the photo-sensitive material layer 1022 on the base substrate 101.

Meanwhile, for the sake of normal operation of the photo-sensitive material layer 1022, a fixed potential needs to be raised for the ITO layer. In an embodiment, the ITO layer is an integral structure forming the entire layer. Namely, as shown in FIG. 1, an orthographic projection of the touch sensing area of the touch electrode layer 1021 on the base substrate 101 is within an orthographic projection of the ITO layer on the base substrate 101. In an embodiment, the ITO layer may be made into separate structures, for example, it is designed to have a structure similar to the pattern of the photo-sensitive material layer, but it must be ensured that all the ITO patterns of the ITO layer are simultaneously at the same potential.

In an embodiment, the touch electrode layer arranged in the photo-sensitive touch element 102 comprises a plurality of touch electrodes, and the type of the touch electrodes can be set as required. In an embodiment, the touch electrode layer comprises a plurality of touch electrodes, and the touch electrodes are self-capacitance electrodes or mutual capacitance electrodes. Detailed explanation is made as follows.

In an embodiment, the touch electrodes are self-capacitance electrodes. The touch sensing area is the area where the touch electrodes are located. When the touch electrodes are self-capacitance electrodes, each of the touch electrodes themselves is a touch sensing area, namely, the touch sensing area is the area where the touch electrodes are located.

Figure 2:
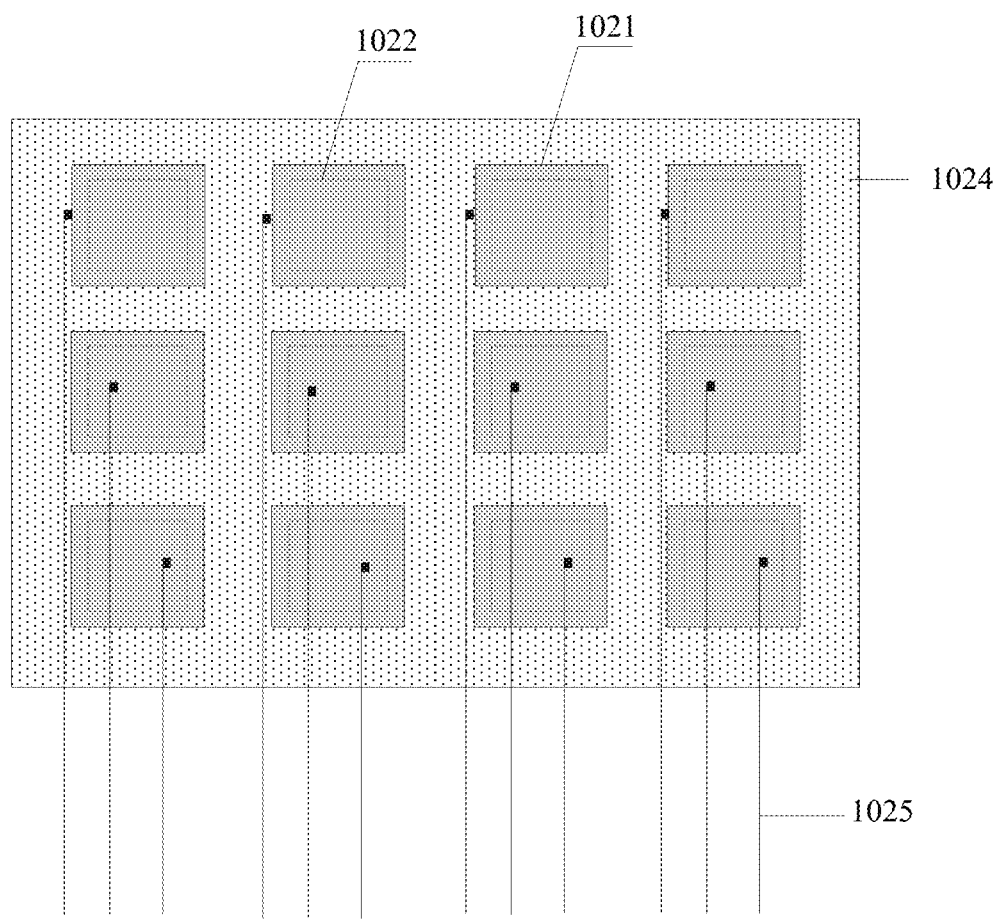
FIG. 2 is a structural schematic top view of a photo-sensitive touch element with a self-capacitance electrode as a touch electrode according to an embodiment of the present disclosure.

FIG. 2 is a structural schematic top view of a photo-sensitive touch element with a self-capacitance electrode as a touch electrode according to an embodiment of the present disclosure. The ITO layer 1024 in the drawing is an integral structure forming an entire layer. The touch electrode layer 1021 comprises a plurality of touch electrodes arranged in a matrix, and the touch electrodes are self-capacitance electrodes.

Correspondingly, the pattern of the photo-sensitive material layer 1022 is a plurality of squares arranged in a matrix. In an embodiment, each square is sized to be 5 mm×5 mm. The squares of dashed lines in the drawing are the pattern of the photo-sensitive material layer. In an embodiment, the pattern of the photo-sensitive material layer can be shaped and sized according to the actual requirements and the shape and size of the touch electrodes.

When the touch electrodes are mutual capacitance electrodes, the touch electrodes comprise driving electrodes and sensing electrodes, and a touch node is formed between each driving electrode and each sensing electrode. Correspondingly, each touch node is a touch sensing area, namely, a touch sensing area is an area where a touch node is located.

The touch electrode may have a double-layered mutual capacitance electrode structure, or have a single-layered mutual capacitance electrode structure as required. As for the specific arrangement, reference can be made to the drawing when the touch electrode is a self-capacitance electrode, and meanwhile an orthographic projection of the touch node on the base substrate completely covers an orthographic projection of a pattern of the photo-sensitive material layer on the base substrate.

In addition, a signal line 1025 of the touch electrode can be made in the same layer as the touch electrode when making the latter, or a layer of metallic wires separately made, as long as the signal transmission on the touch electrode can be realized.

Figure 3:
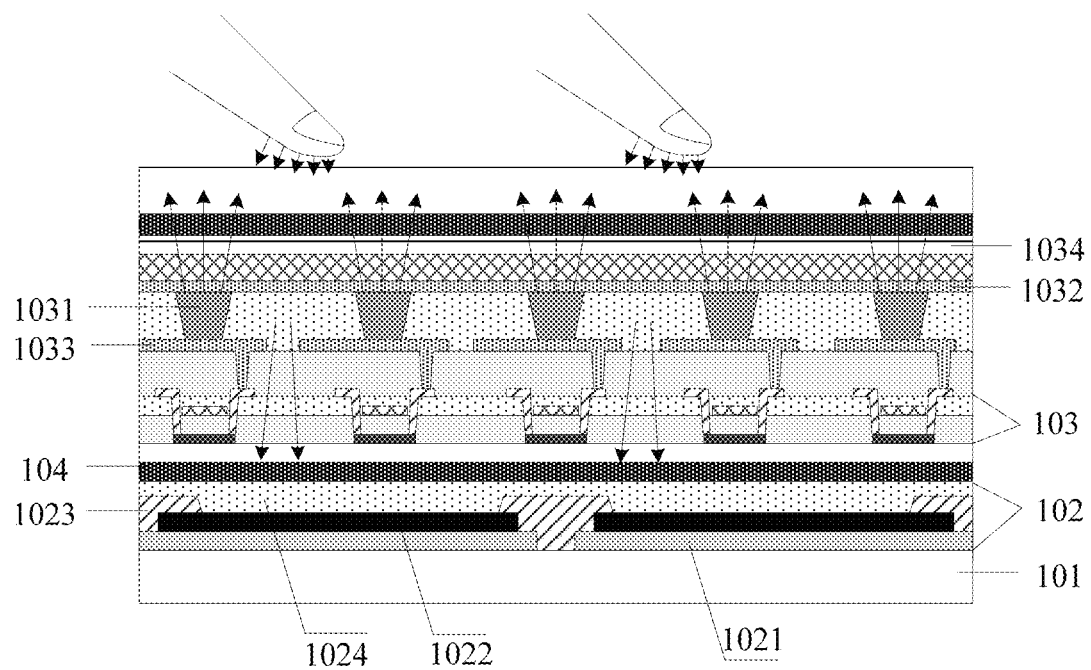
FIG. 3 is a detailed structural schematic view of the touch display substrate according to an embodiment of the present disclosure.

In an embodiment, the touch electrodes can be either self-capacitance electrodes or mutual capacitance electrodes as long as the photo-sensitive material can accurately sense the reflected light. FIG. 3 is a detailed structural schematic view of the touch display substrate according to an embodiment of the present disclosure. In an embodiment, the OLED device 103 can comprise a plurality of sub-pixels 1031, wherein an orthographic projection of each pattern of the photo-sensitive material layer 1022 on the base substrate covers an orthographic projection of multiple sub-pixels 1031 on the base substrate.

To be specific, when a finger is performing a touch operation, the light reflected by the finger can be transmitted onto the photo-sensitive touch element through the area of crevice between anodes of the OLED device without a TFT structure being arranged therein. In order to have a more sensitive photo-sensitive touch function, as shown in FIG. 3, each pattern of the photo-sensitive material layer 1022 can cover two sub-pixels 1031, i.e., it can correspond to at least two crevices. In an embodiment, it is also possible that each pattern of the photo-sensitive material layer 1022 covers three or more sub-pixels 1031 as required.

In an embodiment, the structure of the display substrate part of the touch display substrate may not be limited, and it is not necessary to change the original sequence of manufacturing layers. On the basis of the existing OLED display substrate, the photo-sensitive touch element in the above embodiment is externally arranged at the bottom of the OLED display substrate, so that the touch function can be realized with small changes in design. To be specific, any structure can be used as long as the light reflected by a finger can be transmitted onto the bottom of the display substrate, and all existing display substrates generally can allow the transmission of light through a crevice. But for a better photo-sensitive touch, a feasible structure of the display substrate part of the touch display substrate will be introduced.

To be specific, the display substrate part of the touch display substrate mainly comprises an OLED device. In an embodiment, the OLED device 103 can comprise a cathode 1032 and an anode 1033. The cathode 1032 is made of a translucent electrode material, and the anode 1033 is made of a reflective electrode material, wherein the cathode 1032 of a translucent electrode material allows transmission of a light reflected by a finger, and can usually be made of a material such as Mg or Al. However, the anode 1033 is made of a reflective electrode material, so a light reflected by a finger can only transmit through the crevices between the anodes.

Additionally, in an embodiment, the OLED device 103 can further comprise an anti-reflection circularly polarized light layer 1034 arranged on a side of the OLED device that is remote from the base substrate. The polarized light layer 1034 can be arranged as an anti-reflection circularly polarized light layer that can prevent a light reflected by a metal from entering into human eyes, so that there is no need to arrange a black matrix used for shielding a TFT structure. The light reflected by a finger can directly transmit through the polarized light layer, and transmit onto the photo-sensitive touch element through the area of crevices between the anodes of the OLED device without a TFT structure being arranged therein, so that the photo-sensitive touch element can sense the specific position where the finger touches.

In an embodiment, the display substrate part of the touch display substrate can further comprise a TFT structure. Since the anti-reflection circularly polarized light layer is used in the embodiment, there is arranged no black matrix used for shielding the TFT structure. In an embodiment, the touch display substrate further comprises a TFT structure arranged between the photo-sensitive touch element and the OLED device, wherein the TFT structure is a top-gate structure. If a bottom-gate TFT structure is needed, it is necessary to arrange a black matrix for shielding the TFT structure separately.

The touch display substrate according to some embodiments of the present disclosure can be arranged as an externally arranged touch display substrate as shown in FIGS. 1 and 3, or the photo-sensitive touch element can be embedded into the display substrate as required as long as the normal operation of the display panel is not affected.

Based on the same concept, according to an embodiment of the present disclosure, there is also provided a touch detection method of the touch display substrate for use in the touch display substrate according to any one of the above embodiments of the present disclosure. The touch detection method can be specifically realized by the following step:

when it is determined that a finger is performing a touch operation on the touch display substrate, the photo-sensitive touch element determining a touch position by means of sensing a light reflected by the finger.

Figure 4:
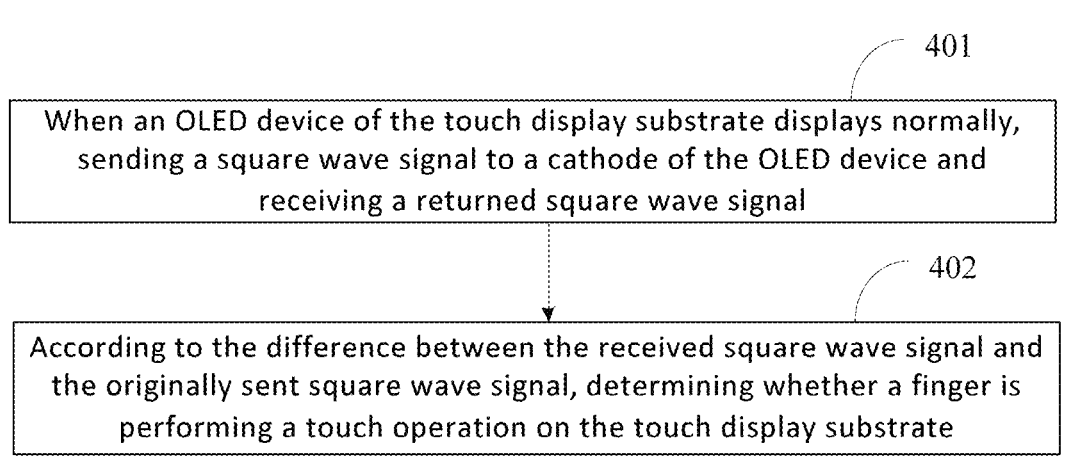
FIG. 4 is a flowchart of a method for determining whether a finger is performing a touch operation according to an embodiment of the present disclosure.

In an embodiment, the touch detection method can further determine the specific touch position by using the photo-sensitive touch element to sense a light reflected by the finger. FIG. 4 is a flowchart of a method for determining whether a finger is performing a touch operation according to an embodiment of the present disclosure. In an embodiment, the method can be specifically realized by the following steps:

Step 401: when an OLED device of the touch display substrate displays normally, sending a square wave signal to a cathode of the OLED device and receiving a returned square wave signal; and Step 402: according to the difference between the received square wave signal and the originally sent square wave signal, determining whether a finger is performing a touch operation on the touch display substrate.

To be specific, after the OLED device of the touch display substrate displays normally, the cathode of the OLED device can first be used to determine whether a finger is performing a touch operation. To be specific, a square wave signal can be sent to the cathode, and a returned square wave signal can be received by the same signal line. Since the square wave signal is fixed, when a finger is performing a touch operation, the capacitance of the cathode increases, and the square wave number and delay time of the returned square wave signal also change. Thus, whether a finger is performing a touch operation on the touch display substrate can be determined according to the difference between the received square wave signal and the originally sent square wave signal.

Figure 5:
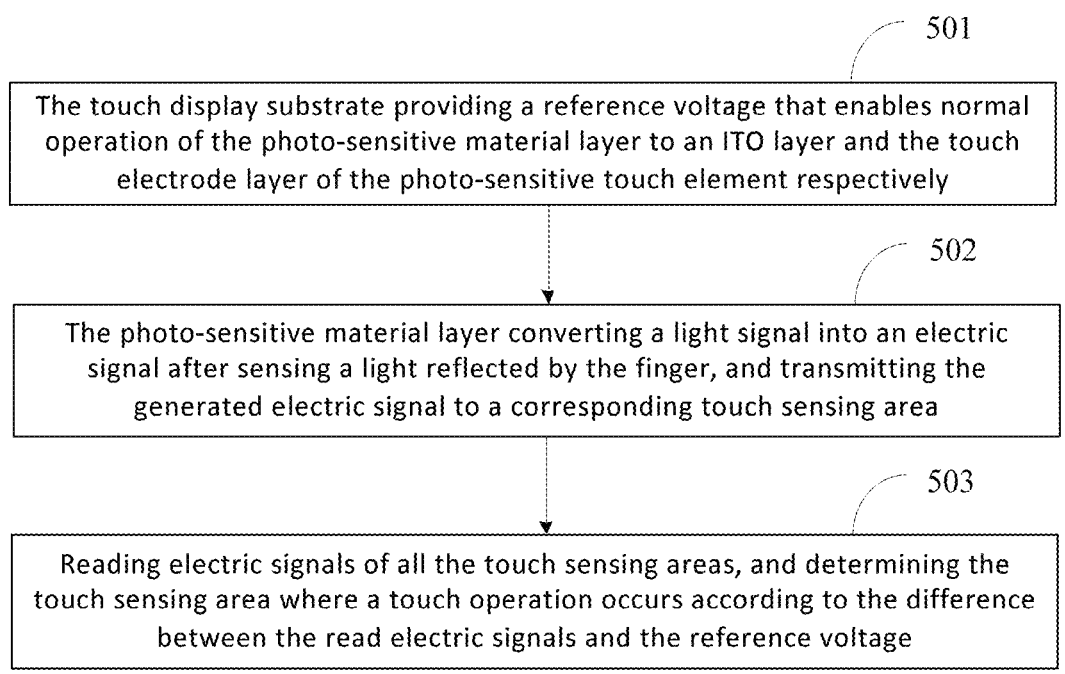
FIG. 5 is a flowchart of a method for determining a touch position according to an embodiment of the present disclosure.

FIG. 5 is a flowchart of a method for determining a touch position according to an embodiment of the present disclosure. In an embodiment, the method can specifically be realized by the following steps:

Step 501: the touch display substrate providing a reference voltage that enables normal operation of the photo-sensitive material layer to an ITO layer and the touch electrode layer of the photo-sensitive touch element respectively;

Step 502: the photo-sensitive material layer converting a light signal into an electric signal after sensing a light reflected by the finger, and transmitting the generated electric signal to a corresponding touch sensing area; and Step 503: reading electric signals of all the touch sensing areas, and determining the touch sensing area where a touch operation occurs according to the difference between the read electric signals and the reference voltage.

In an embodiment, in order to guarantee the normal operation of the photo-sensitive material layer, it is required to form a voltage difference between the ITO layer and the touch electrode layer of the photo-sensitive touch element. The ITO layer is usually arranged as a fixed potential, and all the touch electrodes of the touch electrode layer are arranged at a same potential, such that a voltage difference can be formed between the ITO layer and the touch electrode layer.

The light sent by the OLED device is reflected by a finger and then transmits onto the photo-sensitive touch element through the area of crevices between the anodes of the OLED device without a TFT structure being arranged therein. The photo-sensitive material layer of the photo-sensitive touch element converts a light signal into an electric signal (voltage or current) after sensing the light reflected by the finger, and transmits the generated electric signal to a corresponding touch sensing area.

Meanwhile, electric signals of the touch sensing areas of all the touch electrodes are read. When a touch sensing area receives the electric signal transmitted by the photo-sensitive material layer, the read electric signals of the touch sensing area will be affected. Since reference voltages applied at the touch sensing areas are the same, the touch sensing area where a touch operation occurs can be determined according to the difference between the read electric signals and the reference voltage.

To sum up, some embodiments of the present disclosure provide a touch display substrate and a touch detection method thereof. A photo-sensitive touch element capable of realizing the touch function is arranged between the base substrate and the OLED device. In this way, the embodiment does not change the sequence of manufacturing the layers of an existing display substrate, and since the photo-sensitive touch element is arranged below the OLED device, it will not affect the illumination of the touch display substrate. The embodiments are suitable for manufacturing a large-size touch screen.

It can be understood that the above depictions are merely exemplary embodiments of the present disclosure, but the protection scope of the present disclosure is not limited thereto. It shall be noted that without departing from the spirit and principle of the present disclosure, those ordinarily skilled in the art can conceive of various variations or replacements, which shall fall within the protection scope of the present disclosure. Thus, the protection scope of the present disclosure shall be based on the protection scope of the appended claims.

In the claims, any reference sign in parentheses should not be interpreted as a limitation to the claims. The terms "comprise/include" do not exclude the presence of elements or steps other than those listed in the claims. The word "a" or "an" in front of elements does not exclude the presence of a plurality of such elements. The mere fact that some measures are recited in mutually different dependent claims does not mean that the combination of those measures cannot be utilized to advantage.

What is claimed is:

1. A touch display substrate, comprising:
   a base substrate,
   a photo-sensitive touch element; and
   an organic light-emitting diode device;
   wherein the photo-sensitive touch element and the organic light-emitting diode are arranged on the base substrate sequentially;
   wherein the photo-sensitive touch element comprises a touch electrode layer, a photo-sensitive material layer, an insulating layer and an Indium Tin Oxide layer and wherein the touch electrode layer, the photo-sensitive material layer, the insulating layer, and the Indium Tin Oxide layer are arranged sequentially;
   wherein the touch electrode layer is closer to the base substrate than the photo-sensitive material layer,
   wherein the touch electrode layer further comprises a touch sensing area and an orthographic projection of the touch sensing area on the base substrate, wherein the photo-sensitive material layer further comprises a pattern and an orthographic projection of the pattern on the base substrate,
   wherein the Indium Tin Oxide layer further comprises an orthographic projection on the base substrate, and
   wherein the orthographic projection of the touch sensing area completely covers the orthographic projection of the pattern of the photo sensitive material, and the orthographic projection of the touch sensing area is within the orthographic projection of the Indium Tin Oxide layer, and
   the insulating layer is arranged in a crevice of the pattern of the touch electrode layer and in a crevice of the pattern of the photo-sensitive material layer.

2. The touch display substrate according to claim 1, wherein the Indium Tin Oxide layer is an integral structure forming the entire layer.

3. The touch display substrate according to claim 1, wherein the touch electrode layer comprises a plurality of touch electrodes; and the touch electrodes are selected from the group consisting of mutual capacitance electrodes and self-capacitance electrodes.

4. The touch display substrate according to claim 3, wherein the touch electrodes are self-capacitance electrodes; and the touch electrodes are located within the touch sensing area of the touch electrode layer.

5. The touch display substrate according to claim 4, wherein the pattern of the photo-sensitive material layer is a plurality of squares arranged in a matrix.

6. The touch display substrate according to claim 5, wherein each square is sized to be 5 mm×5 mm.

7. The touch display substrate according to claim 3, wherein the touch electrodes are mutual capacitance electrodes, the touch electrodes comprise driving electrodes and sensing electrodes, and a touch node is formed between each driving electrode and each sensing electrode, wherein each touch node is located within the touch sensing area.

8. The touch display substrate according to claim 1, wherein the organic light-emitting diode device comprises a cathode and an anode, wherein the cathode is made of a translucent electrode material, and the anode is made of a reflective electrode material.

9. The touch display substrate according to claim 1, wherein the organic light-emitting diode device comprises an anti-reflection circularly polarized light layer arranged on a side of the organic light-emitting diode device furthest from the base substrate.

10. The touch display substrate according to claim 9, wherein the touch display substrate further comprises a thin-film transistor structure arranged between the photo-sensitive touch element and the organic light-emitting diode device, wherein the thin-film transistor structure is a top-gate structure.

11. The touch display substrate according to claim 1, wherein the organic light-emitting diode device comprises a plurality of sub-pixels, and wherein an orthographic projection of the pattern of the photo-sensitive material layer on the base substrate covers an orthographic projection of multiple sub-pixels on the base substrate.

12. A touch detection method for use in the touch display substrate according to claim 1, which comprises:
    determining that a finger is performing a touch operation on the touch display substrate when the photo-sensitive touch element senses a light reflected by the finger.

13. The method according to claim 12, wherein the photo-sensitive touch element determining a touch position by sensing a light reflected by the finger comprises:
    the touch display substrate providing a reference voltage that enables normal operation of the photo-sensitive material layer with the Indium Tin Oxide layer and the touch electrode layer of the photo-sensitive touch element respectively;
    the photo-sensitive material layer converting a light signal into an electric signal after sensing the light reflected by the finger, and transmitting the generated electric signal to a corresponding touch sensing area; and
    reading electric signals of all the touch sensing areas, and determining whether a touch operation is occurring according to the difference between the read electric signals and the reference voltage.

* * * * *